(12) United States Patent
Li

(10) Patent No.: US 7,216,306 B1
(45) Date of Patent: May 8, 2007

(54) CHECKPOINT RESTART METHOD USING CONDENSED PARTIAL RESULTS BY DETERMINING BOOLEAN CONSTANT SUBSETS

(76) Inventor: Zhe Li, 1 Argent Dr., Poughkeepsie, NY (US) 12603

( * ) Notice: Subject to any disclaimer, the term of this patent is extended or adjusted under 35 U.S.C. 154(b) by 124 days.

(21) Appl. No.: 11/057,651

(22) Filed: Feb. 14, 2005

Related U.S. Application Data

(63) Continuation of application No. 09/531,633, filed on Mar. 21, 2000, now abandoned.

(60) Provisional application No. 60/125,835, filed on Mar. 24, 1999.

(51) Int. Cl.
*G06F 17/50* (2006.01)
(52) U.S. Cl. .................... 716/1; 716/2; 716/7
(58) Field of Classification Search .............. 716/1, 716/2, 4, 5, 17, 7
See application file for complete search history.

(56) References Cited

U.S. PATENT DOCUMENTS

| 5,032,988 | A | | 7/1991 | van der Linden |
| 5,243,538 | A | | 9/1993 | Okuzawa et al. |
| 5,276,897 | A | | 1/1994 | Stalmarck |
| 5,526,514 | A | | 6/1996 | Pradhan et al. |
| 5,748,486 | A | | 5/1998 | Ashar et al. |
| 5,946,481 | A | | 8/1999 | Kurshan et al. |
| 5,949,691 | A | | 9/1999 | Kurosaka et al. |
| 6,086,626 | A | * | 7/2000 | Jain et al. ............... 716/5 |

OTHER PUBLICATIONS

R. E. Bryant, "Symbolic Boolean Manipulation With Ordered Binary Decision Diagrams", ACM Computing Surveys, vol. 24, No. 3, Sep. 1992, pp. 293-318.
J. R. Burch, V. Singhal, "Tight Integration of Combinational Verification Methods", IEEE/ACM International Conference on Computer Aided Design Digest of Technical Papers, Nov. 1998, IEEE, Piscataway, NJ, USA, pp. 570-576.
C. A. J. van Eijk, "A BDD Based Verification Method for Large Synthesized Circuits", INTEGRATION, the VLSI Journal, vol. 23, No. 2, Nov. 1997, pp. 131-149.
J. Jain et al., "A Survey of Techniques for Formal Verification of Combinational Circuits", Proceedings of IEEE International Conference on Computer Design: VLSI in Computers and Processors, Oct. 1997, IEEE, Piscataway, NJ, USA, pp. 445-454.
J. P. Marques-Silva, K. A. Sakallah, "Boolean Satisfiability in Electronic Design Automation", Proceedings of 37th Design Automation Conference, Jun. 2000, IEEE, Piscataway, NJ, USA, pp. 657-662.
S. Woods, G. Casinovi, "Efficient Solution of Systems of Boolean Equations", IEEE/ACM International Conference on Computer Aided Design Digest of Technical Papers, Nov. 1996, IEEE, Piscataway, NJ, USA.

* cited by examiner

*Primary Examiner*—Thuan Do

(57) ABSTRACT

The present invention provides a method for determining whether a Boolean function is equivalent to a Boolean constant 1 within a given subset of the input space. The given subset is divided into a plurality of smaller subsets regardless how the smaller subsets are chosen. If any of the smaller subsets is not a cube, this smaller subset is divided further. If one of the smaller subsets is a cube, the Boolean function is simplified with constant substitution within the cube. If the simplification result is not a constant, the cube is divided further. If the simplification result is constant 0, a negative conclusion is reached. The conclusion is positive if none of the simplification result is Boolean constant 0. Many of the subset division steps and many of the Boolean function simplification steps can be performed independently of one another, and therefore these independent operations can be performed separately at different times or on different computers. The given subset can expand or shrink dynamically if updates of the given subset are considered in the steps. These dynamic updates make it possible to dynamically adjust the divided subsets.

20 Claims, 3 Drawing Sheets

CHECKPOINT RESTART METHOD USING CONDENSED PARTIAL RESULTS BY DETERMINING BOOLEAN CONSTANT SUBSETS

CROSS-REFERENCE TO RELATED APPLICATIONS

This application claims priority to provisional application No. 60/125,835, titled Partial Tautology Checking Method Using Partial Enumeration and Simplification, and filed on Mar. 24, 1999, the contents of which are herein incorporated by reference.

This is a continuation of application Ser. No. 09/531,633, filed on Mar. 21, 2000.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

This invention relates to computer software algorithms, specifically to reorganizing computing resources in the middle of checking whether a very complex Boolean function is a tautology with a given constraint.

The value of a Boolean function can be either 0 or 1. A Boolean function can depend on any number of variables, and each variable's value can be either 0 or 1. The Boolean function maps each combination of values of these variables to either 0 or 1. A Boolean function is satisfiable if it maps at least one such combination to 1. A Boolean function is a tautology if it maps all combinations to 1. A Boolean function is a tautology if and only if the negation of the Boolean function is not satisfiable.

A tautology checking method decides whether a given Boolean function is a tautology. An equivalence checking method decides whether two given Boolean functions are equivalent. An equivalence checking method can be used as a tautology checking method if one of the two given Boolean functions is Boolean constant 1. A tautology checking method can perform equivalence checking if the given Boolean function is the exclusive nor (XNOR) of two Boolean functions. A given Boolean function is a tautology if and only if it can be simplified to Boolean constant 1. It is sometimes possible to checking tautology for a simple Boolean function with traditional Boolean simplification methods such as applying Boolean simplification theorems and using Karnaugh maps. However, these Boolean simplification methods do not work with slightly complex tautology checking methods because their failure to simplify a Boolean function to a constant does not mean all other methods must also fail.

Because the value of a signal in a digital circuit can be either 1 or 0, digital circuits are often represented as Boolean functions. Equivalence checking methods, satisfiability checking methods and tautology checking methods can be used to check whether two digital circuits are equivalent, which is used in functional design verification of digital circuits. The verification is generally performed as checking the equivalence between a specification and an implementation. In addition to this equivalence, it is well known that these methods can be used to solve other properties of digital circuits in many areas of CAD such as automatic test pattern generation, verification, design error correction, synthesis, physical design, and others. These methods can be very useful when using computers to execute them.

As digital circuits become more and more complex while integrated circuit technologies grow, equivalence checking methods and tautology checking methods often fail to handle the complex Boolean functions used to represent digital circuits. The failures are either due to unreasonably long run times or due to requiring unreasonably large amounts of computer memory. These methods (such as U.S. Pat. No. 5,243,538 and others using BDDs) give meaningful conclusions only at the end, and therefore they give no meaningful conclusions at all if they fail before reaching the end. A truth table of a Boolean function involving 100 Boolean variables can fill more than 1000 trillion storage devices if each of such storage devices can store 1000 trillion rows of the truth table, which is much larger than most modern hard disks or tapes. Just touching such amount of data at the speed of 30 billion rows per second (faster than the modern speed of accessing registers) takes more than a trillion years per pass. It is well known that BDDs of many practical Boolean functions have sizes similar to these truth tables'. This amount of data is similar to the amount of data needed for any method listing the function's output values at all points in the input space. Therefore, any method involving the inspection of output values of a complex Boolean function is impractical if the function has more than 100 variables. Some of these methods are related to adjacency theorem.

A way to avoid such failures is to check equivalence or tautology for only some of all combinations of the variable values. This provides meaningful conclusions before the end of checking for all combinations of the variable values. This is used widely in the industry because each of the ignored combinations is often similar enough to a combination involved in the checking or some combinations are less critical than others. This is normally performed as logic simulation for one combination at a time. When the same combinations are involved, logic simulation is usually much less efficient than equivalence checking methods or tautology checking methods.

There clearly are needs of more efficient methods for checking equivalence or tautology for a given subset of all combinations of the variable values.

BRIEF SUMMARY OF THE INVENTION

The present invention provides a method for determining whether a Boolean function is equivalent to Boolean constant 1 within a given subset of the input space. The given subset is divided into a plurality of smaller subsets regardless how the smaller subsets are chosen. If any of the smaller subsets is not a cube, this smaller subset is divided further. If one of the smaller subsets is a cube, the Boolean function is simplified with constant substitution within the cube. If the simplification result is not a Boolean constant, the cube is divided further. If the simplification result is Boolean constant 0, a negative conclusion is reached. The conclusion is positive if none of the simplification result is Boolean constant 0.

Many of the subset division steps and many of the Boolean function simplification steps can be performed independently of one another, and therefore these independent operations can be performed separately at different times or on different computers. The given subset can expand or shrink dynamically if updates of the given subset are considered in the steps. These dynamic updates make it possible to dynamically adjust the divided subsets.

DETAILED DESCRIPTION OF THE INVENTION

A method for automatically checking whether a Boolean function is equivalent to Boolean constant 1 with a given constraint, using a computer, is disclosed.

A Boolean function is a tautology if the Boolean function maps all points in the entire input space to Boolean constant 1. A tautology is equivalent to Boolean constant 1.

A Boolean function is a conditional tautology if the Boolean function maps all points in a given subset of the input space to Boolean constant 1, while it may map any point outside the given subset of the input space to either Boolean constant. A tautology is a conditional tautology when the entire input space is its given subset of the input space.

Conditional tautologies are easy to check because of the flexibility of doing divide-and-conquer with them. A Boolean function is a conditional tautology with a given subset of the input space if (1) a number of smaller conditional tautologies all share this Boolean function, and
(2) these smaller conditional tautologies' given subsets of the input space jointly cover exactly the large conditional tautology's given subset of the input space (i.e. the large conditional tautology's given subset of the input space is the union of these smaller conditional tautology's given subsets of the input space).

A cube, as well known in the art, is a subset of the input space where some input variables are substituted with Boolean constant 1 and some other input variables are substituted with Boolean constant 0, which is called the substitution requirements provided by the cube in this specification. The count of points in a cube must be 1, 2, 4, or any other power of 2 because zero or more input variables are completely free to take any values (as they are not substituted with either Boolean constant according to the substitution requirements provided by the cube). A cube of 0 point does not occur in this context. A Boolean function is a conditional tautology with a cube as the given subset of the input space if the Boolean function is simplified to Boolean constant 1 after the input variables in the Boolean function are substituted with these 1's or 0's according to the substitution requirements provided by the cube. As the substitution's consequence, the cube becomes the entire input space of the new Boolean function, and therefore it turns conditional tautology checking into tautology checking.

Figure 1:
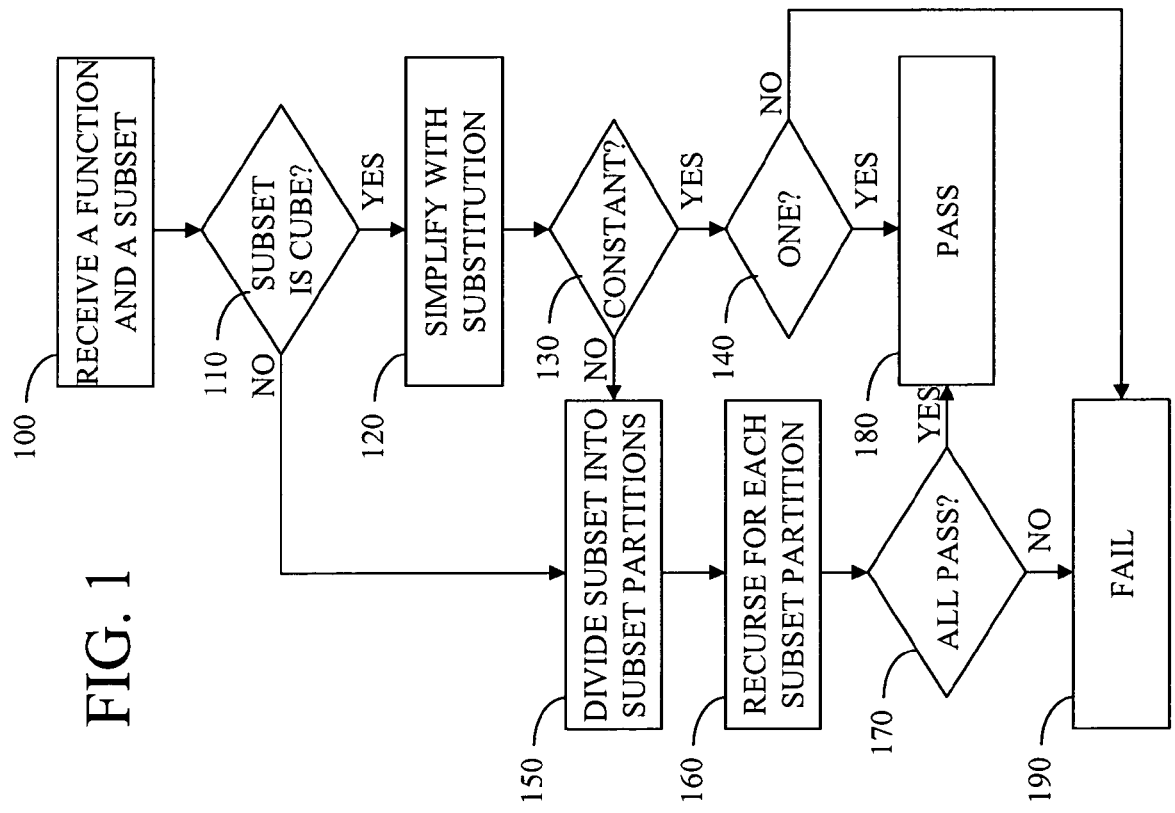
FIG. 1 illustrates, in flow diagram form, a recursive process for conditional tautology checking.

Conditional tautology checking can be performed in a recursive process as illustrated in FIG. 1. The process starts with a step 100 receiving a Boolean function and a given subset of the input space. A step 110 is performed next to determine whether to go to a step 120 or a step 150. It must go to step 150 if the given subset of the input space is not a cube. It may go to either step 120 or step 150 under other conditions, but it must go to step 120 if the given subset of the input space includes only one point. The Boolean function is simplified in step 120 with substituting input variables in the Boolean function with Boolean constants according to the substitution requirements provided by the cube (the given subset of the input space). A step 130 is performed after step 120 to check the simplification result before going to step 150 or another step 140. Step 150 is performed next if the simplification result is not a Boolean constant. Otherwise step 140 is performed next to look at the Boolean constant resulted from the simplification. The positive conclusion is given in a step 180 after step 140 if the simplification result is Boolean constant 1. The negative conclusion is given in a step 190 after step 140 if the simplification result is Boolean constant 0. The negative conclusion may include at least one counter example indicating the substitution of the input variables with the Boolean constants.

In step 150, the given subset of the input space is divided into several smaller subsets of the input space before moving on to a step 160. For each of these smaller subsets of the input space, the conditional tautology checking process, starting from step 100, is performed recursively for the Boolean function (the simplified copy if after step 120) with this smaller subset as the given subset of input space. After all such recursions of step 160, a step 170 is performed to summarize all conclusions collected from these recursions. If all the collected conclusions are positive, the positive conclusion is given in step 180. If any of the collected conclusions is negative, the negative conclusion is given in step 190.

The strategy of dividing a subset of the input space into smaller ones, in step 150, can be arbitrary (manual or automatic), and a process of conditional tautology checking can use a mixture of several such strategies. Any strategy can get correct answer after a finite number of the recursive divisions because all smaller subsets of the input space cannot get smaller than the smallest cubes (also known as individual points of the input space). Because each of the smallest cubes has all input variables substituted with Boolean constants, it always gets the Boolean function simplified to a Boolean constant after a finite number of divisions.

In some cases, the strategy of dividing a subset of the input space, in step 150, is to divide it into the largest cubes within the subset because this causes applying simplification, in step 120, as early as possible. In some other cases, smaller cubes are preferred because large cubes have more chances to waste the simplification efforts in step 120. A larger cube often has smaller chance to result in a Boolean constant from simplification with constant substitution in step 120. These cubes may overlap with each other, and it depends on specific cases whether it is better to allow this overlapping or not.

Figure 2:
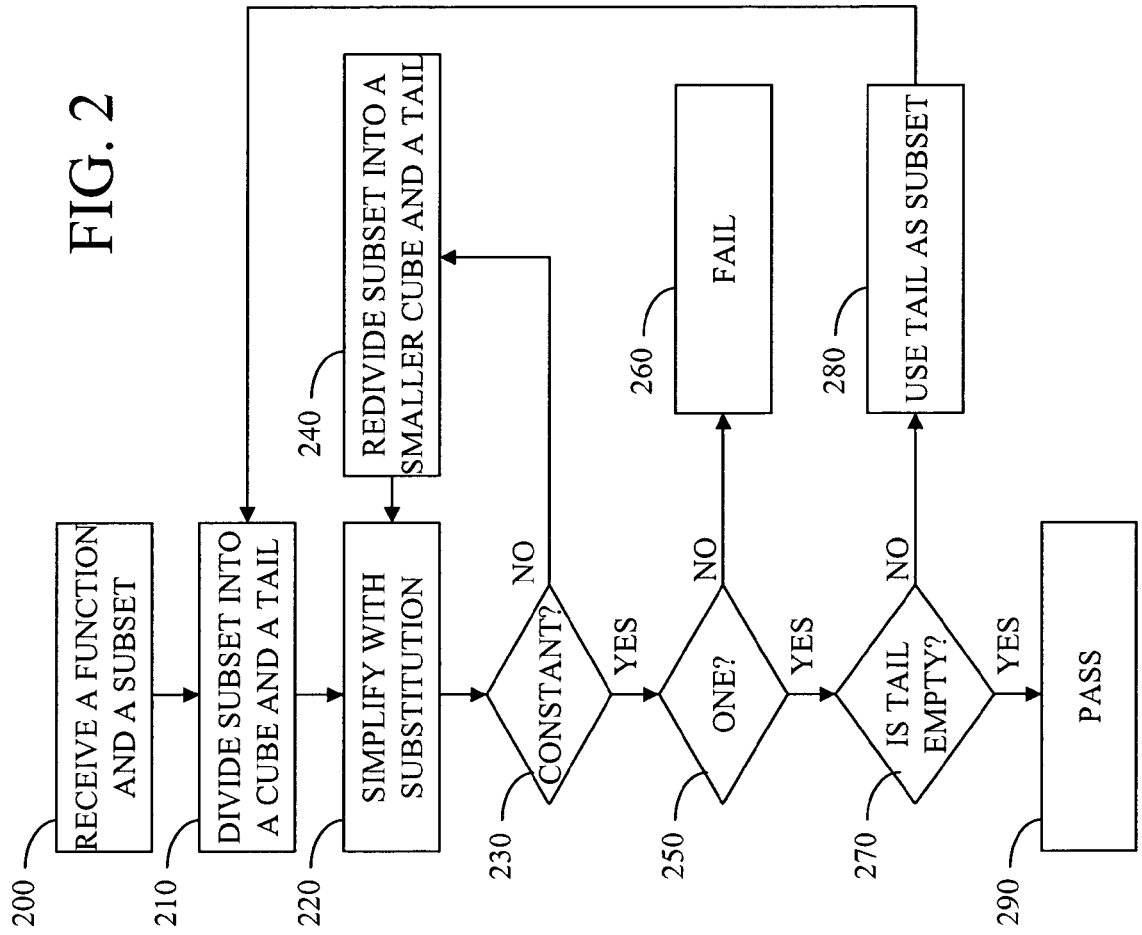
FIG. 2 illustrates, in flow diagram form, an iterative process for conditional tautology checking.

Conditional tautology checking can also be performed in the following iterative process illustrated in FIG. 2. The iterative process starts with a step 200 receiving a Boolean function and a given subset of the input space. A step 210 is performed next to divide the given subset of the input space into two subsets. One is called a cube subset and the other is called a tail subset. The cube subset is a cube in the input space. If the given subset is a cube itself and it is chosen to be the cube subset, the tail subset is empty. A step 220 is performed after step 210 to simplify the Boolean function with substituting input variables in the Boolean function with Boolean constants according to the substitution requirements provided by the cube (the given subset of the input space). The simplification result can be used to replace the original Boolean function in all following steps and iterations if the tail subset is empty. Otherwise the original Boolean function is preserved for all following steps and iterations, and the simplification result can be used temporarily as the Boolean function to be simplified again in the next round, as described below, unless any further simplification is not needed because the simplification result is already a Boolean constant.

A step 230 is then performed to check the simplification result before performing a step 240 or another step 250. If the simplification result is not a Boolean constant, step 240 is performed to make the cube subset a smaller cube by dividing the given subset of input space similarly to in step 210, and step 220 is performed again after step 240 for the smaller cube with the last simplification result as the Boolean function to simplify. Otherwise step 250 is performed next to look at the Boolean constant resulted from the simplification before performing a step 260 or another step 270. The negative conclusion is given in step 260 if the simplification result is Boolean constant 0. The negative conclusion may include at least one counter example indicating the substitution of the input variables with the Boolean constants. If the simplification result is Boolean constant 1, step 270 is performed to examine whether the tail subset from step 210 or step 240 is empty. If the tail subset is empty, the positive conclusion is given in a step 290. Otherwise a step 280 is performed making the tail subset the new given subset of the input space before looping back to step 210.

There are many ways to represent a Boolean function in a computer for a program to process. Because the representation of Boolean functions is only involved in the simplification and the constant substitution within steps 120 and 220, this invention can use any computer-oriented representation that is concise and fast to build for complex Boolean functions that involve more than 100 Boolean variables. Plain truth tables are not good for this purpose because they take too much memory (due to the more than 1000 trillion rows) for more than 50 Boolean variables. Binary decision diagrams are not good for this purpose because they sometimes have sizes similar to plain truth tables, and are not fast to build in many cases. The preferred embodiment uses netlists to represent Boolean functions. A netlist may also be called a logic circuit or a directed acyclic graph. Each node of the netlist is a circuit block (a logic gate, a Boolean expression, a truth table, etc.). As well known in the art, a netlist is the natural representation of an interconnected collection of circuit components. Accordingly, steps 120 and 220 also have to use computer-oriented simplification algorithms. The simplification algorithms in the preferred embodiment include constant propagation.

There are different ways to represent a subset of the input space. One way is to use a characteristic function. A Boolean function is a characteristic function of a subset of the input space if its value is 1 for and only for all points in the subset. Another way is to use ranges of binary integers.

Given an ordering of all the input variables, each point of the input space can be represented as a binary integer. Each bit of the binary integer represents the value of each input variable. The total count of these binary integers is the Nth power of two where N is the number of input variables. The lower bound of these binary integers is zero. A range of these binary integers represents a subset of the input space. A range has a lower bound and an upper bound, and it includes all binary integers between the two bounds (i.e. all binary integers that are greater than or equal to the lower bound and smaller than or equal to the upper bound). Any subset of the input space can be represented as one or more ranges of binary integers jointly (i.e. the subset is the union of the one or more subsets that are represented as the ranges) though certain subset of the input space may only be represented as multiple ranges of binary integers.

A range of these binary integers represents a cube if the only difference between the range's upper bound and the range's lower bound is at all the rightmost bits (specifically, the rightmost bits of the range's lower bound, which have to be all 0's, all correspond to 1's in the rightmost bits of the range's upper bound, respectively). A range from 10000 to 10111 represents a cube. A range from 10100 to 10110 does not represent a cube. A range from 10010 to 10111 does not represent a cube. A range of any single binary integer represents a cube. The range of all N-bit binary integers represents a cube.

Given any range, the range representing a cube that covers the first part of the given range can be easily identified because
(1) it shares the lower bound with the given range,
(2) its upper bound is obtained by turning the rightmost zero or more 0's of its lower bound into 1's, and
(3) its upper bound is smaller than or equal to the given range's upper bound.

If several cubes satisfy these three conditions, one cube is selected depending on the chosen strategy. The selected cube divides the given range into two ranges: a range representing the cube and the other range representing the rest.

Based on the range representation of subsets of the input space, the conditional tautology checking method can be modified to handle a range whose upper bound is dynamically shifting. This shifting is useful because it enables dynamic division of a subset of the input space into several. The division criteria can be dynamically decided on-the-fly based on the changing factors of the computing environment. These changing factors can include any interrupts, memory shortage and time limit. It is the most interesting if the range is shrinking so that the cube used for simplification at the moment is completely outside the range: simply go to step 290 if it is in any other step. If the range is extending, the tail subset need to be extended to the upper bound of the range before step 270.

Furthermore, checking different conditional tautologies can be in different computing environment. For example, some smaller conditional tautologies can be moved to other computers to continue checking. This is like taking a checkpoint and restarting from the checkpoint right away or a while later, in the same environment or in a similar environment. Such checkpoint-restart is sometimes useful even in the same environment and without pausing because it serves as a simple form of garbage collection. It is sometimes better to check a small conditional tautology based on the residual internal data structures from checking some other conditional tautology so that the effort to build up the internal data structures is not repeated. Other times, it is more efficient to check a small conditional tautology with the minimal internal data structures so that it can reduce the effort to manage the internal data structures.

More generally, checking a conditional tautology can be performed as checking several smaller conditional tautologies concurrently if the division is decided in advance. Then each of the smaller conditional tautologies can be checked with dynamic divisions if the given subset of the input space of the smaller conditional tautology can be represented as a range of binary integers. Checking each smaller conditional tautology can start from either end of the range of binary integers representing the given subset of the input space of this smaller conditional tautology. It can start from different ends for checking different ones of these smaller conditional tautologies. If desired, the iterative process and the recursive process can be mixed in checking a conditional tautology. Different processes can be used either at different levels of the divisions or for different smaller subsets of the input space from the same division. When the (given or smaller) subset of the input space is a cube, any other tautology checking method in addition to simplification can also be applied after constant substitution.

With these flexible division techniques, very large Boolean functions can be handled in tautology checking even if such a Boolean function involves much more than 100 Boolean variables. This is required for automatically verifying large data-processing systems using computers, especially when verifying them against the expected behaviors without any assumptions of their internal structures.

Figure 3:
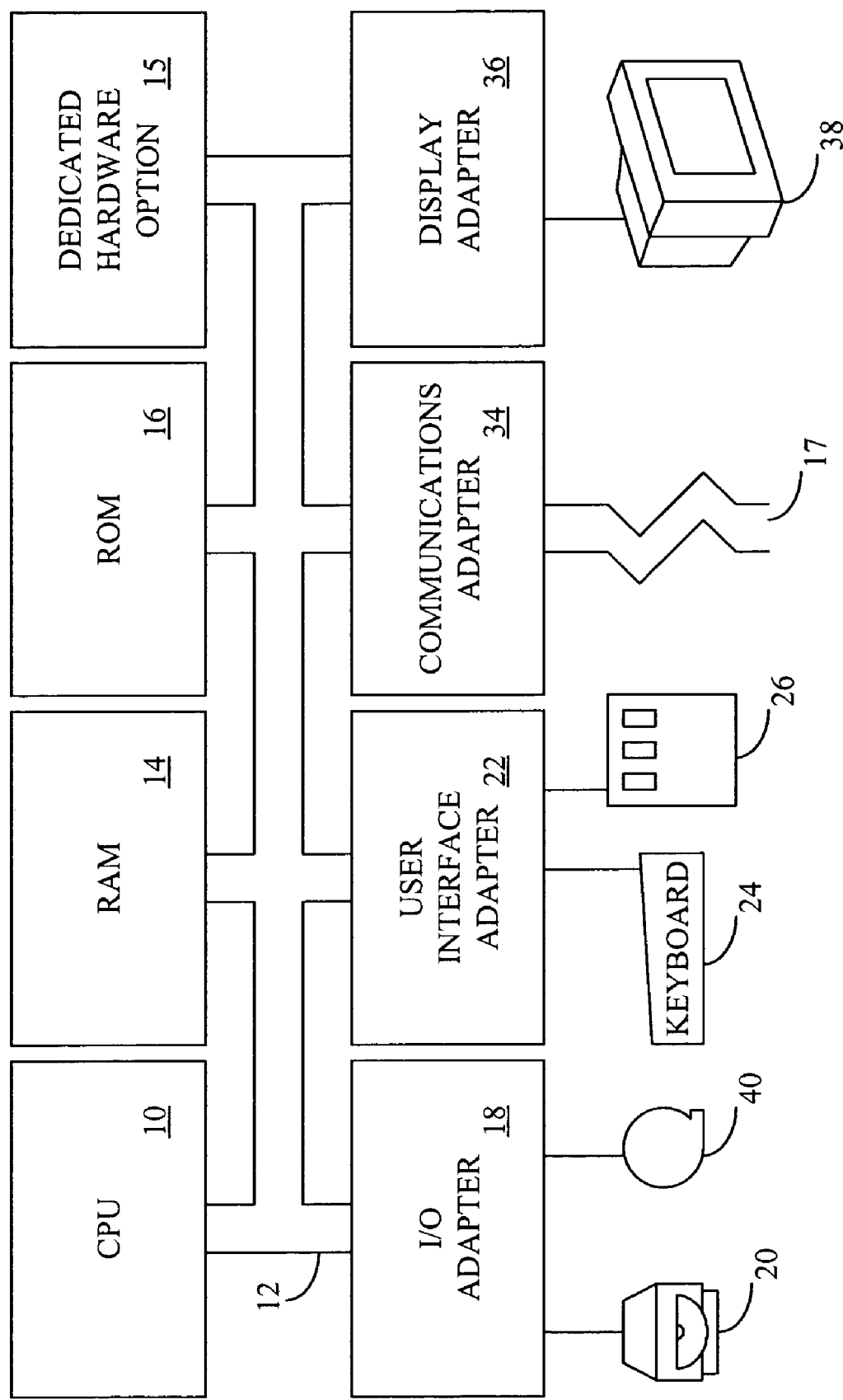
FIG. 3 is a representative computer system in conjunction with which the embodiments of the present invention may be implemented.

The invention discussed above may be implemented within dedicated hardware 15 as illustrated in FIG. 3 or within processes implemented within a data processing system 13. A typical hardware configuration of a workstation, that may be implemented to accomplish the method disclosed herein, is illustrated and includes a central processing unit (CPU) 10, such as a conventional microprocessor, and a number of other units interconnected via a system bus 12. The workstation shown in FIG. 3 includes random access memory (RAM) 14, read only memory (ROM) 16, and input/output (I/O) adapter 18 for connecting peripheral devices, such as disk units 20 and tape units 40, to bus 12. A user interface adapter 22 is used to connect a keyboard device 24 and a mouse 26 to system bus 12. Other user interface devices such as a touch screen device (not shown) may also be coupled to system bus 12 through user interface adapter 22.

A communication adapter 34 is also shown for connecting the workstation to a data processing network 17. Further, a display adapter 36 connects system bus 12 to a display device 38. The method of the present invention may be implemented and stored in one or more of disk units 20, tape drive 40, ROM 16 and/or RAM 14, or even made available to system 13 via network 17 through communication adapter 34 and thereafter processed by CPU 10. Since the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

While the above invention has been described with reference to certain preferred embodiments, the scope of the present invention is not limited to these embodiments. One skilled in the art may find variations of these preferred embodiments that, nevertheless, fall within the spirit of the present invention, whose scope is defined by the claims set forth below.

I claim:

1. A method using computers for determining whether a complex Boolean function representing a property of digital circuits is equivalent to a Boolean constant within a given subset of the input space, comprising the steps of:
   receiving said complex Boolean function;
   receiving said Boolean constant, whereby it is used to compare said complex Boolean function with;
   receiving said given subset of the input space, whereby everything beyond said given subset of the input space is irrelevant, and said given subset of the input space can have any shape as it is given; and
   dividing said given subset of the input space into a set of a plurality of smaller subsets of the input space, whereby the equivalence is determined positive if said complex Boolean function is equivalent to said Boolean constant within every member of said set of a plurality of smaller subsets of the input space while completely avoiding the capacity problem with representing said complex Boolean function as any Binary Decision Diagram.

2. A method using computers for determining whether a complex Boolean function representing a property of digital circuits is equivalent to a Boolean constant within a given subset of the input space, as in claim 1 further comprising the step of:
   determining whether said given subset of the input space is a cube; and
   simplifying, if said given subset of the input space is a cube, said complex Boolean function with substituting the input variables in said complex Boolean function with Boolean constants according to the substitution requirements provided by said cube, whereby the conclusion is positive if the simplification result is said Boolean constant, and the conclusion is negative if the simplification result is a Boolean constant other than said Boolean constant.

3. A method using computers for determining whether a complex Boolean function representing a property of digital circuits is equivalent to a Boolean constant within a given subset of the input space, as in claim 2 further comprising the step of:
   replacing said complex Boolean function with the simplification result of the simplifying step before the dividing step, whereby the simplification result is used as said complex Boolean function in all later steps.

4. A method using computers for determining whether a complex Boolean function representing a property of digital circuits is equivalent to a Boolean constant within a given subset of the input space, as in claim 1 wherein a member of said set of a plurality of smaller subsets of the input space is a cube within said given subset of the input space, whereby it is valid to substitute the input variables in said complex Boolean function with Boolean constants according to the substitution requirements provided by said cube.

5. A method using computers for determining whether a complex Boolean function representing a property of digital circuits is equivalent to a Boolean constant within a given subset of the input space, as in claim 4 further comprising the step of:
   simplifying said complex Boolean function with substituting the input variables in said complex Boolean function with Boolean constants according to the substitution requirements provided by said cube, whereby the conclusion is positive if the simplification result is said Boolean constant, and the conclusion is negative If the simplification result is the Boolean constant other than said Boolean constant.

6. A method using computers for determining whether a complex Boolean function representing a property of digital circuits is equivalent to a Boolean constant within a given subset of the input space, as in claim 5 further comprising the step of:
   repeating the dividing step and the simplifying step if the simplification result is not a Boolean constant, whereby said cube is smaller and the simplification result will eventually be a Boolean constant when said cube is small enough.

7. A method using computers for determining whether a complex Boolean function representing a property of digital circuits is equivalent to a Boolean constant within a given subset of the input space, as in claim 4 wherein said given subset of the input space is represented as a first range of binary integers.

8. A method using computers for determining whether a complex Boolean function representing a property of digital circuits is equivalent to a Boolean constant within a given subset of the input space, as in claim 7 wherein said set of a plurality of smaller subsets of the input space has only two members: said cube which is represented as a second range of binary integers, and a second member which is represented as a third range of binary integers, whereby said third range of binary integers is divided repeatedly into cubes and such divisions do not need to all complete if the negative conclusion is given for any of these cubes.

9. A method using computers for determining whether a complex Boolean function representing a property of digital circuits is equivalent to a Boolean constant within a given subset of the input space, as in claim 8 further comprising the step of:
  replacing said given subset of the input space, represented as said first range of binary integers, with said second member of said set of a plurality of smaller subsets of the input space, represented as said third range of binary integers, after finishing all steps related to said cube and said second range of binary integers which represents said cube, whereby said given subset of the input space become smaller and smaller and whether said complex Boolean function is equivalent to said Boolean constant within said given subset of the input space can be determined using simplification when said given subset of the input space eventually becomes a cube.

10. A method using computers for determining whether a complex Boolean function representing a property of digital circuits is equivalent to a Boolean constant within a given subset of the input space, as in claim 9 further comprising the step of:
  shifting a boundary of said third range of binary integers before the replacing step if the corresponding boundary of said first range of binary integers is shifted, whereby a boundary of said first range of binary integers can shift dynamically.

11. A method using computers for determining whether a complex Boolean function representing a property of digital circuits is equivalent to a Boolean constant within a given subset of the input space, as in claim 4 further comprising the step of:
  substituting the input variables in said complex Boolean function with Boolean constants according to the substitution requirements provided by said cube, whereby any tautology checking method can be used to process the Boolean function resulted from the substitution.

12. A method using computers for determining whether a complex Boolean function representing a property of digital circuits is equivalent to a Boolean constant within a given subset of the input space, as in claim 11 wherein said given subset of the input space is represented as a first range of binary integers.

13. A method using computers for determining whether a complex Boolean function representing a property of digital circuits is equivalent to a Boolean constant within a given subset of the input space, as in claim 12 wherein said set of a plurality of smaller subsets of the input space has only two members: said cube which is represented as a second range of binary integers, and a second member which is represented as a third range of binary integers, whereby said third range of binary integers is divided repeatedly into cubes and such divisions do not need to all complete if the negative conclusion is given for any of these cubes.

14. A method using computers for determining whether a complex Boolean function representing a property of digital circuits is equivalent to a Boolean constant within a given subset of the input space, as in claim 13 further comprising the step of:
  replacing said given subset of the input space, represented as said first range of binary integers, with said second member of said set of a plurality of smaller subsets of the input space, represented as said third range of binary integers, after finishing all steps related to said cube and said second range of binary integers which represents said cube, whereby said given subset of the input space become smaller and smaller and whether said complex Boolean function is equivalent to said Boolean constant within said given subset of the input space can be determined using simplification when said given subset of the input space eventually becomes a cube.

15. A method using computers for determining whether a complex Boolean function representing a property of digital circuits is equivalent to a Boolean constant within a given subset of the input space, as in claim 14 further comprising the step of:
  shifting a boundary of said third range of binary integers before the replacing step if the corresponding boundary of said first range of binary integers is shifted, whereby a boundary of said first range of binary integers can shift dynamically.

16. A method using computers for determining whether a complex Boolean function representing a property of digital circuits is equivalent to a Boolean constant within a given subset of the input space, as in claim 14 further comprising the step of:
  deleting the unnecessary internal data structures after finishing all steps related to said cube and said second range of binary integers which represents said cube, whereby the effort to maintain the internal data structures is reduced without causing any incorrect operations in the future iterations after the replacing step.

17. A method using computers for determining whether a complex Boolean function representing a property of digital circuits is equivalent to a Boolean constant within a given subset of the input space, as in claim 1 wherein said complex Boolean function is represented as a netlist, whereby a high capacity is achieved by avoiding any Binary Decision Diagrams.

18. A method using computers for determining whether a complex Boolean function representing a property of digital circuits is equivalent to a Boolean constant within a given subset of the input space, as in claim 1 wherein said Boolean constant is 1, whereby the method checks a conditional tautology.

19. A method using computers for determining whether a complex Boolean function representing a property of digital circuits is equivalent to a Boolean constant within a given subset of the input space, as in claim 1 further comprising the step of:
  determining whether said given subset of the input space is a cube; and substituting, if said given subset of the input space is a cube, the input variables in said complex Boolean function with Boolean constants according to the substitution requirements provided by said cube, whereby any tautology checking or satisfiability checking method can be used to process the Boolean function resulted from the substitution.

20. A method using computers for determining whether a complex Boolean function representing a property of digital circuits is equivalent to a Boolean constant within a given subset of the input space, as in claim 1 further comprising the step of:

starting a process for each member of said set of a plurality of smaller subsets of the input space determining whether said complex Boolean function is equivalent to said Boolean constant within said member of said set of a plurality of smaller subsets of the input space, whereby these processes can run on the same computer or on several computers, at the same time or at different times.

* * * * *